(12) United States Patent
Han et al.

(10) Patent No.: US 6,313,527 B1
(45) Date of Patent: Nov. 6, 2001

(54) DUAL-DIES PACKAGING STRUCTURE AND PACKAGING METHOD

(75) Inventors: Charlie Han, Hsinchu Hsien; Te-Sheng Yang, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/210,270

(22) Filed: Dec. 10, 1998

(51) Int. Cl.⁷ ..................................................... H01L 23/34
(52) U.S. Cl. ............................................. 257/723; 257/777
(58) Field of Search ................................. 257/723, 777, 257/666, 686

(56) References Cited

U.S. PATENT DOCUMENTS

| | | | |
|---|---|---|---|
| 5,438,224 | * | 8/1995 | Papageorge et al. ................. 257/777 |
| 6,072,243 | * | 6/2000 | Nakanishi .............................. 257/777 |

* cited by examiner

Primary Examiner—Roy Potter

(57) ABSTRACT

A dual-dies packaging structure is provided. The dual-dies packaging structure includes a lead frame, which further includes a die pad and several lead legs, in which the die pad includes an upper surface and a lower surface. A first die, having several first bonding pads, is fixed on the upper surface of the die pad by, for example, gluing it. The first bonding pads remain exposed. A second die, having several second bonding pads, is fixed on the lower surface by, for example, gluing it. The second bonding pads remain exposed. A bumping redistribution structure layer is located on the second die so as to redistribute each of the second bonding pads to a pseudo-bonding pad. Each pseudo-bonding pad has its proper location with respect to the first bonding pads. Thus, when several bonding wires are used to bond the first bonding pads and the pseudo-bonding pads to the lead legs, bonding wires can be regularly and simply put on without crossing or entangling to each other.

14 Claims, 4 Drawing Sheets

DUAL-DIES PACKAGING STRUCTURE AND PACKAGING METHOD

BACKGROUND OF THE INVENTION

1. Field of the Invention

This invention relates to semiconductor die packaging, and more particularly to a dual-dies packaging structure, and a packaging method.

2. Description of Related Art

As a device integration continuously increases, a more efficient packaging structure of dies is also desired by manufacturers. In order to more effectively use an available space, two dies may be packaged together in an integrated circuit (IC) chip, in which these two dies may have either similar function or different function. Thus, the dual-dies IC chip can have a greater capability or more various functions. However, it is difficult to achieve this kind of dual-dies packaging structure.

When two dies are to be packaged together, these two dies usually are respectively mounted on both sides of a lead frame. If these two dies have an identical circuit layout, such as two dynamic random access memory (DRAM) dies to increase memory capacity, those bonding wires between bonding pads and the lead frame inevitably need to cross to each other or even entangle together. In order to avoid this issue, several dual-dies packaging structures are proposed.

FIG. 1 is a cross-sectional view of an IC chip, schematically illustrating a conventional dual-dies packaging structure. In FIG. 1, an usual dual-dies packaging structure includes a die pad 14, which is horizontally set. A die 12 is fixed on an upper surface of the die pad 14, and a die 16 is fixed on a lower surface of the die pad 14. The die 16 is a mirror die with respect to the die 12 so that bonding wires 10 are not necessarily crossed to each other. In this conventional manner, the circuit layout of the die 16 is necessary to be extra designed to fit its mirror structure with respect to the die 12. This increases fabrication time and fabrication cost.

FIG. 2 is a cross-sectional view of an IC chip, schematically illustrating an another conventional dual-dies packaging structure. In FIG. 2, a die pad 33 is horizontally set in a space. According to the geometry location of the die pad 33, the die pad 33 includes an additional circuit, called an interposer 36, located on a lower surface of the die pad 33. An usual die 32 is fixed on an upper surface of the die pad 33, a die 34, identical to the die 32, is fixed on a lower surface of the die pad 33. The interposer 36 is used to convert bonding pad locations of the die 34 into a new locations so that bonding wires 30 for the die 34 need not cross each other. This conventional method has it limitation. If a die dimension is large and occupies most of the area of the die pad 33, then there is no available area on the die pad 33 for forming the interposer 36. Moreover signal is led out through the interposer 36, the signal may be distorted. An unequal bonding length may also cause a signal delay.

There is also another dual-dies packaging structure. A die pad is replaced by a printed circuit board. Through a layout of the printed circuit board, signals of dies can be led out. This method also has it drawbacks. Since the material of the printed circuit board and the packaging glue have a poor glue performance. This cause an increase of fabrication cost to obtain a sufficient glue strength. Moreover, the signals may also distorted.

SUMMARY OF THE INVENTION

It is therefore an objective of the present invention to provide a dual-dies packaging structure, which makes use of a bumping redistribution method to relocate bonding pad location so that the relocated bonding pad pattern has a match with an usual bonding pad pattern. The dies therefore can be easily and symmetrically bonded out through bonding wires. A signal delay is also avoided.

It is another an objective of the present invention to provide a more efficient packaging method to package dual-dies so that dual-dies simply packaged with a lower fabrication cost and a lower fabrication time.

In accordance with the foregoing and other objectives of the present invention, a dual-dies packaging structure is provided. The dual-dies packaging structure includes a lead frame, which further includes a die pad and several lead legs, in which the die pad includes a first surface and a second surface. A first die with several first bonding pads is fixed on the first surface of the die pad by, for example, gluing it. The first bonding pads remain exposed. A second die, having several second bonding pads, is fixed on the second surface by, for example, gluing it. The second bonding pads remain exposed. A bumping redistribution structure layer is located on the second die so as to redistribute each of the second bonding pads to a pseudo-bonding pad. Each pseudo-bonding pad has its proper location with respect to the first bonding pads. Thus, when several bonding wires are used to bond the first bonding pads and the pseudo-bonding pads to the lead legs, bonding wires can be regularly and simply put on without crossing or entangling to each other. All this coupling structure described above is firmly sealed by a packaging glue material, such as resin. When the dual-dies packaging structure is done, some other packaging processes are performed to accomplish an IC chip.

In the foregoing in accordance with the above objective and other objectives of the present invention, a dual-dies packaging method is also provided. The dual-dies packaging method includes fixing a first die on one surface of a die pad, that is, a first surface of the die pad. The die pad is a part of a lead frame, which further includes several lead legs. The first die includes several first bonding pads, which are exposed. Using a bumping redistribution method to form a bumping redistribution structure layer on the second die to redistribute its second bonding pads forms several pseudo-bonding pads on the second die. The second die is fixed by, for example, glue on a second surface of the die pad, which is opposite to the first surface. The pseudo-bonding pads have proper relative locations to the first bonding pad of the first bonding pads. Thus, when several bonding wires are used to bond the first bonding pads and the pseudo-bonding pads to the lead legs, bonding wires can be regularly and simply put on without crossing or entangling to each other. A packaging glue/firm process is performed to seal the first die, the second die, the die pad, the bonding wire, and the bumping redistribution structure layer and form a firmed IC chip.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
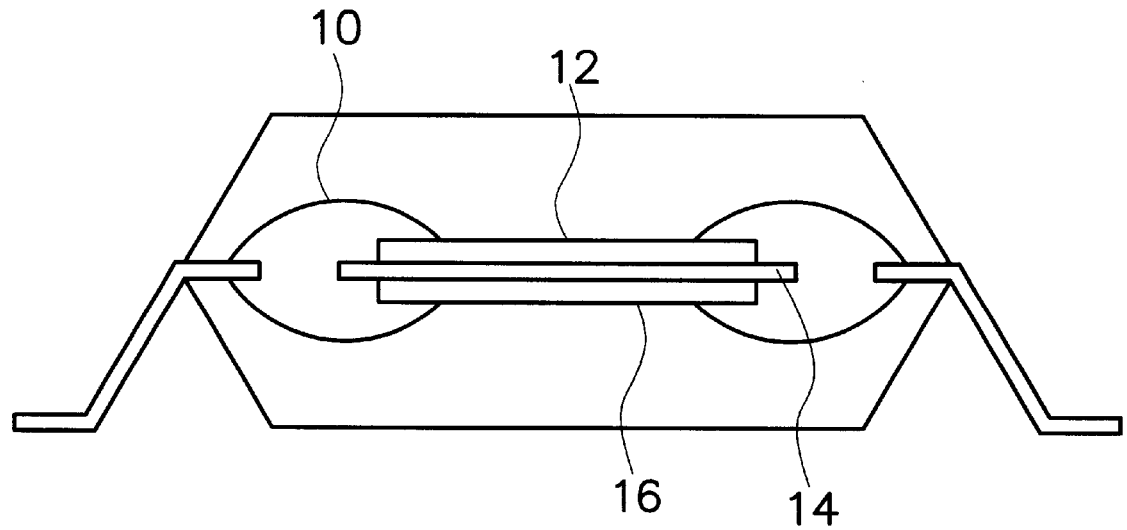
FIG. 1 is a cross-sectional view of an IC chip, schematically illustrating a conventional dual-dies packaging structure.
Figure 2:
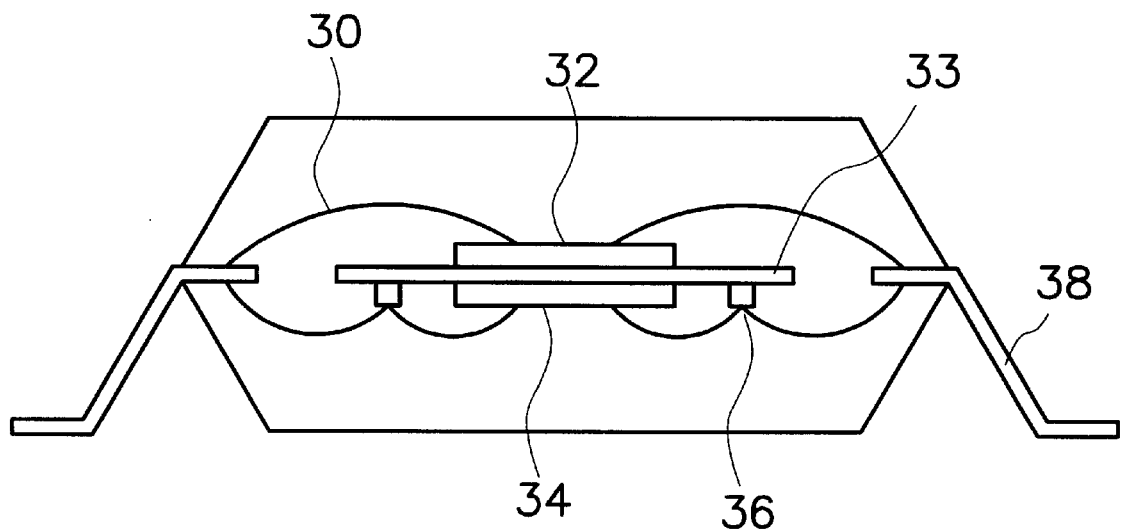
FIG. 2 is a cross-sectional view of an IC chip, schematically illustrating an another conventional dual-dies packaging structure.
Figure 3:
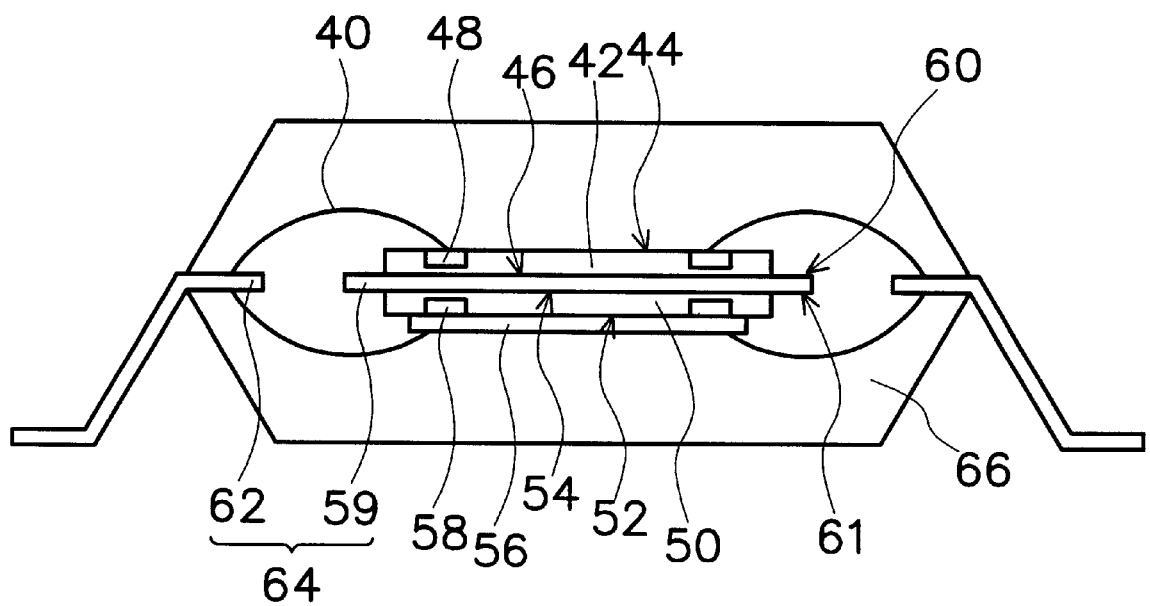
FIG. 3 is a cross-sectional view of an IC chip, schematically illustrating a dual-dies packaging structure according to a preferred embodiment of the invention.

FIG. 3 is a cross-sectional view of an IC chip, schematically illustrating a dual-dies packaging structure, according to a preferred embodiment of the invention. In FIG. 3, there is a lead frame 64, which includes a die pad 59 and several lead legs 62. The die pad 59 has an upper surface 60 and a lower surface 61, which are so-called from a geometric point of view. A die 42 is fixed on the upper surface 60 of the die pad 59 by, for example, gluing it at its backside. The die 42 includes several bonding pad 48 on its front side 44. A die 50 with a bumping redistribution structure layer 56 is fixed on the lower surface 61 of the die pad 59 by, for example, gluing it at its back side. The die 50 includes several bonding pad 58 on its front side 52, on which the bumping redistribution structure layer 56 is formed on it. The bumping redistribution structure layer 56 is used to redistribute the bonding pads 58 of the die 50 so as to respectively obtain several pseudo-bonding pads in the bumping redistribution structure layer 56. Details of the bumping redistribution structure layer 56 are to be described later. When the die 50 is fixed on the lower surface 61 of the die pad 59, the pseudo-bonding pads in the bumping redistribution structure layer 56 have proper distribution to functionally match the bonding pads 48 of the die 42 so that bonding wires 40 can be simply put on to connect the bonding pads 48 of die 42 and the pseudo-bonding pads in the bumping redistribution structure layer 56 to the adjacent lead legs 62 without crossing or entangling to each other. After bonding wires 60 are put on, the lead frame 64 with dies 42, 50, bumping redistribution structure layer 56, and bonding wires 60 is firmly sealed by a packaging glue, such resin so as to obtain a firm IC device. Since this part to accomplish the IC chip packaging is not related to the invention and is well known by the one skilled in the art, it is not further detailedly described here.

Figure 4:
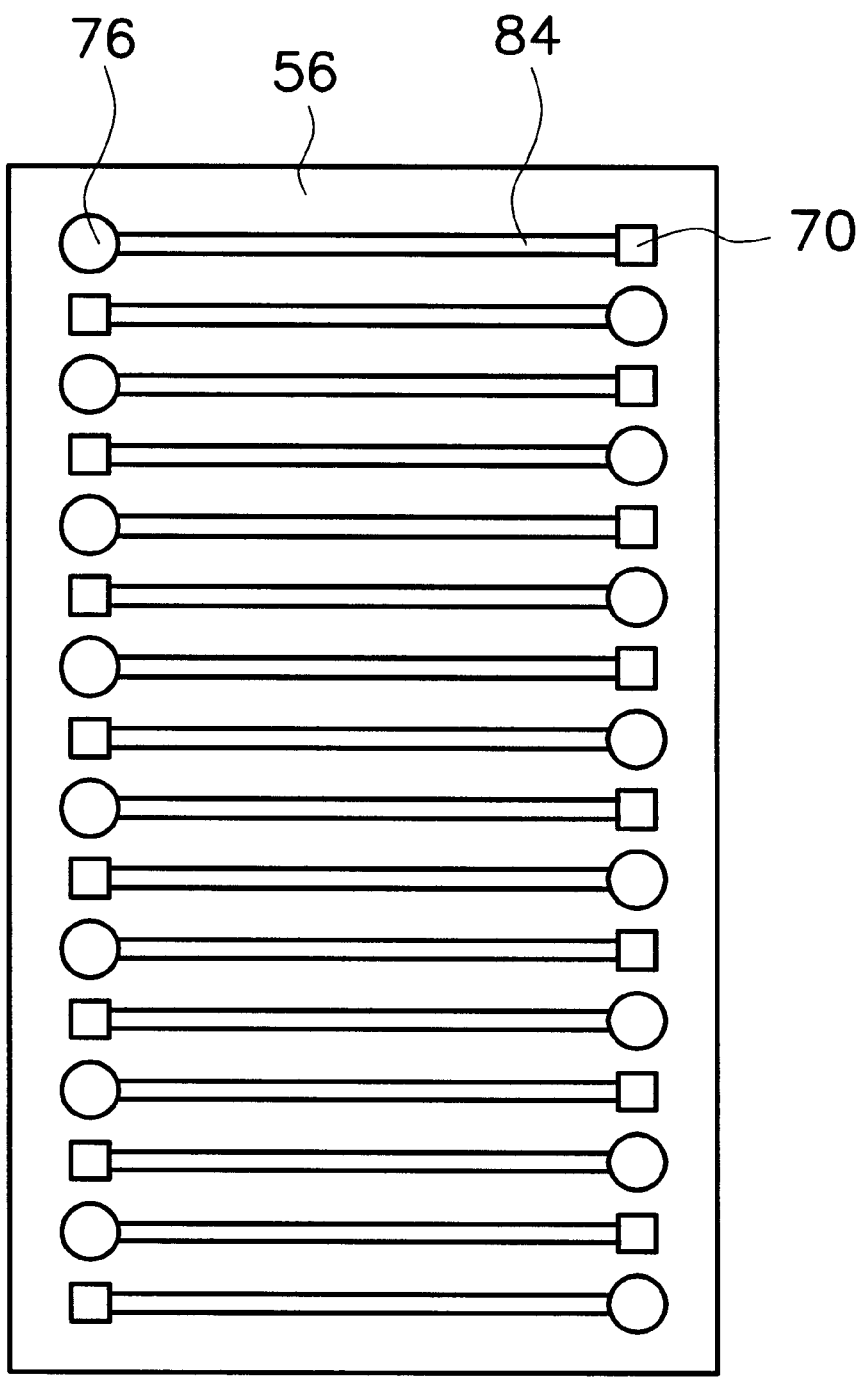
FIG. 4 is a schematic drawing, illustrating a layout of a bumping redistribution structure.

About the bumping redistribution structure layer 56, its structure layout is illustrated in FIG. 4. FIG. 4 is a schematic drawing, illustrating a layout of a bumping redistribution structure. In FIG. 3 and FIG. 4, the bumping redistribution structure layer 56 includes several bonding-pad conductive lines 84. For each of the conductive lines 84, one end of one bonding-pad conductive line 84 has one via plug 76, and the opposite end has one pseudo-bonding pad 70. When the bumping redistribution structure layer 56 is formed on the die 50 at its front side 52, the via plug 76 is exactly electrically coupled to one of the bonding pads 58 of the die 50 so that the bonding pads 58 is redistributed to the pseudo-bonding pad 70. For example, for a common situation that the die 42 and the die 50 are identical, such as a DRAM die, its layout including several bonding-pad conductive lines 84 is schematically illustrated in FIG. 4. The pseudo-bonding pads 70 are simply located on the opposite end of the original bonding pads 58 of the die 50, where is the location of the via plugs 76. In this manner, the pseudo-bonding pads 70 are respectively very close to the bonding pads of the die 42 with the same function so that the bonding wires 40 to be connected to its corresponding lead legs 62 are easily and simply put on without crossing or entangling to each other.

Figure 5:
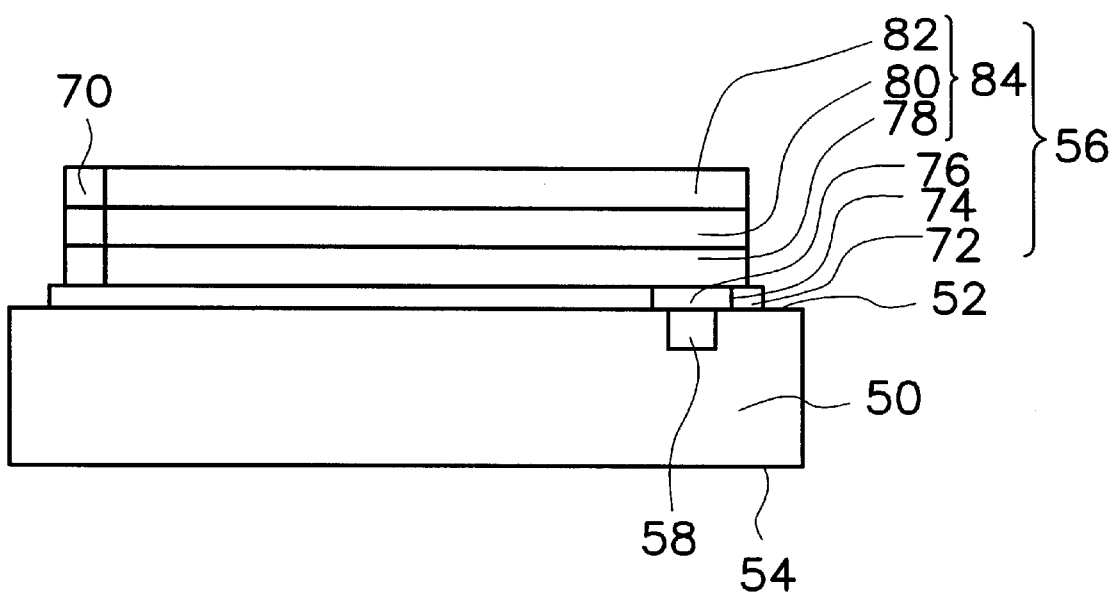
FIG. 5 is a cross-sectional view of a die with a bumping redistribution structure layer, schematically illustrating a detailed structure of the bumping redistribution structure layer.

FIG. 5 is a cross-sectional view of a die with a bumping redistribution structure layer, schematically illustrating a detailed structure of the bumping redistribution structure layer. In FIGS. 3–5, a method to form the bumping redistribution structure layer 56 is also described in the following descriptions. The method starts from the die 50, of which the backside 54 is glued on the die pad 59 at its lower surface 61. The front side 52 of the die 50 includes the bonding pads 58. In this cross-sectional view, only one bonding pad 58 is presented. A water resistance layer 72 including, for example, polyimide is formed over the die 50 at its front side 52. The water resistance layer 72 is patterned to form a via opening 74 in the water resistance layer 72 so as to expose the bonding pad 58. The conductive plug 76 is formed to fill the via opening 74. A lower conductive line layer 78 including, for example, copper is formed on the water resistance layer 72 to have an electric coupling with the conductive via plug 76. A middle conductive line layer 80 including, for example, nickel is formed on the lower conductive line layer 78. An upper conductive line layer 82 including, for example, gold (Au) is formed on the middle conductive layer 80. All of the lower, middle, and upper conductive line layers 78, 80, 82 form the bonding-pad conductive line 84. The end portion opposite to the via plug 76 serves as the pseudo-bonding pad 70. As a result, the bonding pad 58 is redistributed to the pseudo-bonding pad 76.

When the die 42 and the die 50 with bumping redistribution structure layer 56 are respectively glued on the upper surface 60 and the lower surface 61 of the die pad 59, the bonding wire 40, which usually includes a metal wire coated with gold or a gold wire, is put on between the lead legs 62 and the pseudo-bonding pad 70. The whole coupling structure is sealed by a packaging glue material 66, such as resin, to fix the whole coupling structure. A packaged IC chip is formed.

In the above descriptions, the die 50 can be either identical or different to the die 42. The packaging method is even suitable for several dies greater then two. In this case, each of dies 50 on the lower surface 61 of the die pad 59 has an individual bumping redistribution structure layer 56. Moreover, the die 42 and the die 50 can also be respectively fixed on the lower surface 61 and the upper surface 60 of the die pad 59. The properties of the invention remain the same.

In conclusion, the invention has several characteristics as follows:

1. Two dies 42, 50 are packaged in one die pad 59 so that the packaging density is increased. Using the bumping redistribution structure layer 56 fabricated in a low fabrication cost, the packaged chip at least double its capability.
2. The dual-dies packaging structure is achieved without a need of redesign a mirror die like the one in the conventional packaging method.
3. Since the bumping redistribution structure layer 56 is formed with a compact space, the line length difference between the original bonding pad 58 and the pseudo-bonding pad 70 to the lead leg 62 is short, the signal time delay is effectively avoided.
4. The bumping redistribution structure layer 56 is not limited by the dimension of the die pad 59, in which the area dimension of the bumping redistribution structure layer 56 is about equal to the area dimension of the die 50.
5. The packaging method of the invention is suitable for either two identical dies or two different dies, or even for several dies greater than two.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A dual-dies packaging structure comprising:
   a lead frame, which comprises a die pad and a plurality of lead legs;
   a first die, which comprises a first front side having a plurality of first bonding pads, and is fixed to the die pad through its backside, wherein the die pad comprises a first surface used to hold the first die;
   a second die, which comprises a second front side having a plurality of second bonding pads, and is fixed to the die pad through its backside, wherein the first die is identical to the second die, and the die pad comprises a second surface, which opposites to the first surface holds the second die;
   a bumping redistribution structure layer located on the second front side of the second die so as to respectively redistribute the second bonding pads to a plurality of pseudo-bonding pads, which are respectively closely located at mirror symmetric locations of the first bonding pads, wherein the first binding pads and the pseudo-bonding pads having similar function are closely grouped together; and
   a plurality of bonding wires, being put on to electrically connect the first bonding pads and the pseudo-bonding pads to the corresponding lead legs with a simple connection layout.

2. The structure of claim 1, wherein the structure further comprises a package glue material to firmly seal the structure but leave a portion of each of the lead legs to be exposed.

3. The structure of claim 1, wherein the bumping redistribution structure layer comprises:
   a water resistance layer, which is located on the second front side of the second die, and comprises a plurality of conductive via plugs in the water resistance layer to respectively have electrical coupling with the second bonding pads; and
   a plurality of bonding-pad conductive lines on the water resistance layer, each of which redistribute one of the second bonding pads to one of the pseudo-bonding pads through one of the conductive via plugs, wherein each of the pseudo-bonding pads is each end portion of the bonding-pad conductive lines.

4. The structure of claim 3, wherein each of the bonding-pad conductive lines further comprises:
   a lower conductive line layer, located on the water resistance layer to have electrical coupling with one of the conductive via plug;
   a middle conductive line layer, located on the lower conductive line layer; and
   an upper conductive line layer, located on the middle conductive line layer.

5. The structure of claim 4, wherein the lower conductive line layer comprises copper, the middle conductive line layer comprises nickel, and the upper conductive line layer comprises gold.

6. The structure of claim 3, wherein the water resistance layer comprises polyimide.

7. The structure of claim 3, wherein the bonding wire comprises gold coated metal wire comprises gold.

8. A dual-dies packaging structure comprising:
   a lead frame, which comprises a die pad and a plurality of lead legs;
   a first die, which comprises a first front side having a plurality of first bonding pads, and is fixed to the die pad through its backside, wherein the die pad comprises a first surface used to hold the first die;
   a second die, which comprises a second front side having a plurality of second bonding pads, and is fixed to the die pad through its backside, wherein the first die is not identical to the second die, and the die pad comprises a second surface, which opposites to the first surface holds the second die;
   a bumping redistribution structure layer located on the second front side of the second die so as to respectively redistribute the second bonding pads to a plurality of pseudo-bonding pads, which have proper locations to functionally match the first bonding pads, wherein the first binding pads and the pseudo-bonding pads having similar function are closely grouped together;
   a plurality of bonding wires, being put on to electrically connect the first bonding pads and the pseudo-bonding pads to the corresponding lead legs with a simple connection layout.

9. The structure of claim 8, wherein the structure further comprises a package glue material to firmly seal the structure but leave a portion of each of the lead legs to be exposed.

10. The structure of claim 8, wherein the bumping redistribution structure layer comprises:
    a water resistance layer, which is located on the second front side of the second die, and comprises a plurality of conductive via plugs in the water resistance layer to respectively have electrical coupling with the second bonding pads; and
    a plurality of bonding-pad conductive lines on the water resistance layer, each of which redistribute one of the second bonding pads to one of the pseudo-bonding pads through one of the conductive via plugs, wherein each of the pseudo-bonding pads is each end portion of the bonding-pad conductive lines.

11. The structure of claim 10, wherein each of the bonding-pad conductive lines further comprises:
    a lower conductive line layer, located on the water resistance layer to have electrical coupling with one of the conductive via plug;
    a middle conductive line layer, located on the lower conductive line layer; and
    an upper conductive line layer, located on the middle conductive line layer.

12. The structure of claim 11, wherein the lower conductive line layer comprises copper, the middle conductive line layer comprises nickel, and the upper conductive line layer comprises gold.

13. The structure of claim 10, wherein the water resistance layer comprises polyimide.

14. The structure of claim 10, wherein the bonding wire comprises gold coated metal wire comprises gold.

* * * * *